(12) United States Patent
Horie

(10) Patent No.: US 6,897,567 B2
(45) Date of Patent: May 24, 2005

(54) METHOD OF MAKING WIRELESS SEMICONDUCTOR DEVICE, AND LEADFRAME USED THEREFOR

(75) Inventor: Yoshitaka Horie, Kyoto (JP)

(73) Assignee: Romh Co., Ltd., Kyoto (JP)

( * ) Notice: Subject to any disclaimer, the term of this patent is extended or adjusted under 35 U.S.C. 154(b) by 0 days.

(21) Appl. No.: 09/917,945

(22) Filed: Jul. 31, 2001

(65) Prior Publication Data

US 2002/0014704 A1 Feb. 7, 2002

(30) Foreign Application Priority Data

Jul. 31, 2000 (JP) .......................................... 2000-230971
Mar. 15, 2001 (JP) .......................................... 2001-073569

(51) Int. Cl.[7] .............................................. H01L 23/48
(52) U.S. Cl. ...................... 257/779; 257/772; 257/666; 257/672; 257/673; 257/782
(58) Field of Search ................................ 257/666, 670, 257/672, 673, 675, 677, 734–736, 772, 779, 782, 796; 438/123, 411, 461, 611, 612

(56) References Cited

U.S. PATENT DOCUMENTS

| | | | | |
|---|---|---|---|---|
| 4,005,454 A | * | 1/1977 | Froloff et al. ................ | 257/772 |
| 4,498,096 A | * | 2/1985 | Addie et al. ................. | 257/772 |
| 4,500,904 A | * | 2/1985 | Onuki et al. ................. | 257/771 |
| 4,920,574 A | * | 4/1990 | Yamamoto et al. ......... | 257/714 |
| 4,935,803 A | * | 6/1990 | Kalfus et al. ................ | 257/735 |
| 4,980,568 A | * | 12/1990 | Merrick et al. ............... | 257/81 |
| 4,994,412 A | * | 2/1991 | Kalfus et al. ................ | 438/123 |
| 5,821,611 A | | 10/1998 | Kubota et al. .............. | 257/673 |
| 5,888,850 A | * | 3/1999 | Havens et al. .............. | 438/127 |
| 6,307,755 B1 | * | 10/2001 | Williams et al. ............ | 257/666 |
| 6,396,127 B1 | * | 5/2002 | Munoz et al. ............... | 257/735 |

\* cited by examiner

Primary Examiner—Eddie Lee
Assistant Examiner—Quang Vu
(74) Attorney, Agent, or Firm—Michael Bednarek; Pillsbury Winthrop Shaw Pittman LLP

(57) ABSTRACT

A method of making a semiconductor device is provided. The method includes the following steps. First, a semiconductor chip is mounted on a lower conductor, with first solder material applied between the chip and the lower conductor. Then, an upper conductor is placed on the chip, with second solder material applied between the chip and the upper conductor. Then, the first and the second solder materials are heated up beyond their respective melting points. Finally, the first and the second solder materials are allowed to cool down, so that the first solder material solidifies earlier than the second solder material.

15 Claims, 18 Drawing Sheets

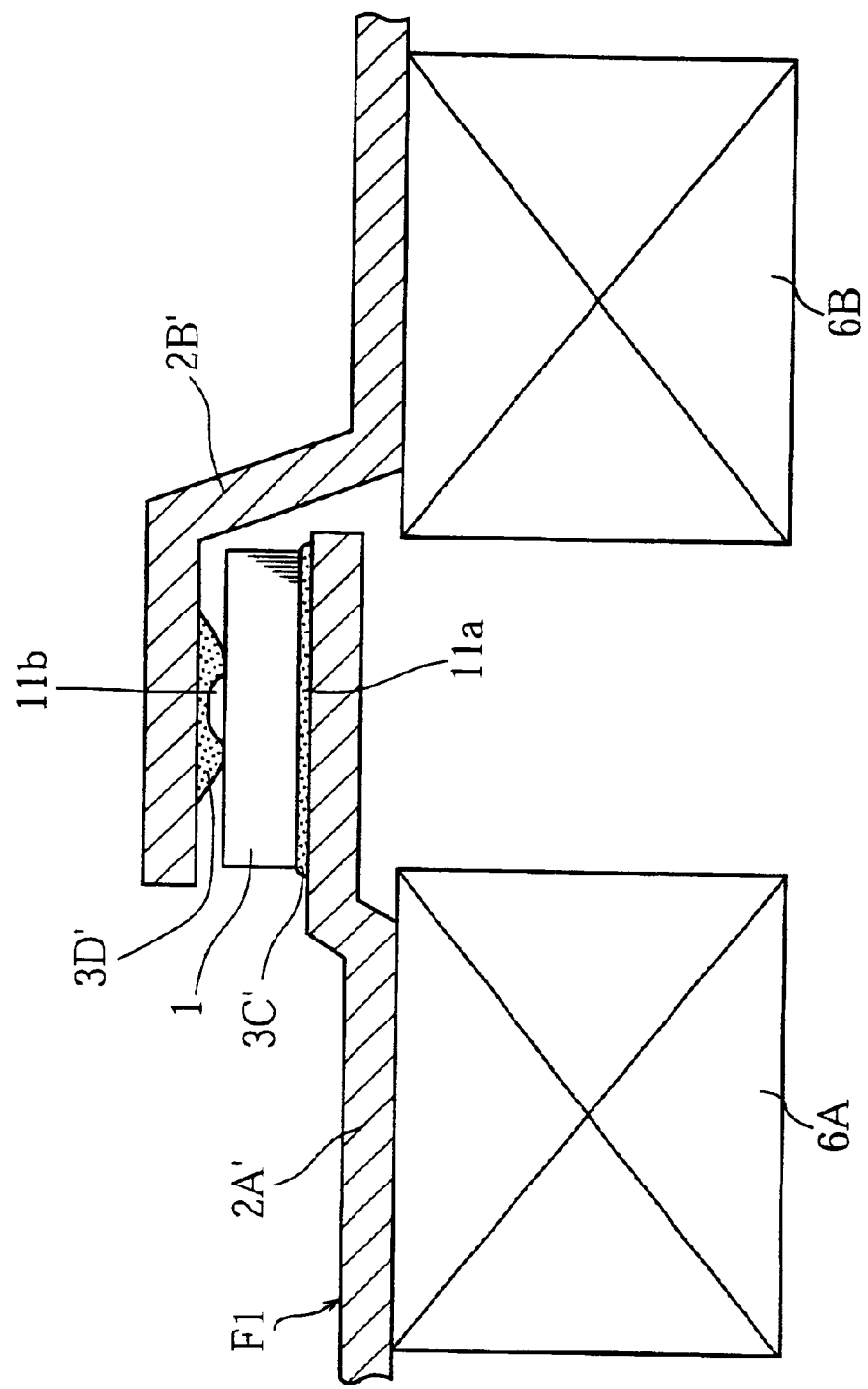

METHOD OF MAKING WIRELESS SEMICONDUCTOR DEVICE, AND LEADFRAME USED THEREFOR

BACKGROUND OF THE INVENTION

1. Field of the Invention

The present invention relates to a method of making a wireless semiconductor device. The present invention also relates to a leadframe used for employing such a method.

2. Description of the Related Art

FIG. 18 of the accompanying drawings shows the basic structure of a conventional wireless semiconductor device. In this specification, "wireless" refers to a structure wherein terminal leads are directly soldered to a semiconductor chip, thereby using no connection wires.

As seen from FIG. 18, the conventional device S' includes a semiconductor chip 90, a first lead 91a, and a second lead 91b. The chip 90 is provided with a flat lower electrode 90a on its bottom surface, and with a protruding upper electrode 90b on its top surface. The lower electrode 90a is connected to the first lead 91a via solder Ha, while the upper electrode 90b is connected to the second lead 91b via solder Hb. The chip 90 and inner portions of the leads 91a, 91b are enclosed by a resin package 92. The projecting portions of the leads 91a, 91b are flush with the bottom surface of the package 92, so that the device S' can readily be surface mounted on a printed circuit board.

The conventional device S' is fabricated in the following manner. First, referring to FIG. 19, a conductive leadframe 91 is prepared. The frame 91 includes connection strips 91a' and 91b'. The strips 91a', 91b' are bent in a manner such that their terminal portions are vertically spaced. Then a semiconductor chip 90 is placed between these terminal portions, with solder paste H(Ha, Hb) applied, as shown in the figure. Then, this intermediate assembly of the chip 90 and frame 91 is moved into a furnace (not shown) to melt the solder paste H. Afterward, the chip-frame assembly is taken out of the furnace, to cause the molten solder H to solidify. Thereafter, though not shown in the figure, a resin package is formed to enclose the chip 90 together with parts of the connection strips 91a', 91b'. Finally, the strips 91a', 91b' are cut off from the frame 91, so that a product device is obtained.

While the conventional semiconductor device S' is functional, it suffers from the following drawback.

In the device S', the solder Ha and the solder Hb have the same composition, thereby exhibiting the same melting point. Thus, when the chip-frame assembly is taken out from the furnace after the applied solder has been melted, it can happen that the upper solder Hb may solidify earlier than the lower solder Ha.

However, when the solidification of the upper solder Hb precedes that of the lower solder Ha, the semiconductor chip 90 may be pulled toward the upper connection strip 91b', as shown in FIG. 20, thereby tilting unduly. In the conventional device, the protruding upper electrode 90b tends to aggravate the unbalanced state of the chip 90. Unfavorably, the tilting of the chip 90 may leave an undesired large gap S between the chip 90 and the connection strip 91a'. The gap S may damage otherwise good electrical conduction between the chip 90 and the strip 91a'. In addition, the tilting of the chip 90 may cause the upper solder Hb in a molten state to run down the chip 90 onto the lower solder Ha, thereby short-circuiting the lower and the upper strips 91a', 91b'.

SUMMARY OF THE INVENTION

The present invention has been proposed under the circumstances described above. It is, therefore, an object of the present invention to provide a fabrication method of wireless semiconductor devices enjoying proper electrical conduction between the leads and the semiconductor chip.

Another object of the present invention is to provide a conductive frame used for employing such a method.

According to a first aspect of the present invention, there is provided a method of making a semiconductor device. The method includes the following steps. First, a semiconductor chip is mounted on a lower conductor, with first solder material applied between the chip and the lower conductor. Then, an upper conductor is positioned on the chip, with second solder material applied between the chip and the upper conductor. Then, the first and the second solder materials are heated up beyond melting points of the respective materials. Finally, the first and the second solder materials are solidified in a manner such that the solidification of the first solder material is completed earlier than the second solder material.

Preferably, the melting point of the first solder material may be higher than the melting point of the second solder material. Alternatively, the heating of the first solder material may be terminated earlier than the heating of the second solder material. In this case, the first and the second solder materials may have the same melting points.

Preferably, the heating of the first and the second solder materials may be performed by contacting the lower and the upper conductors with first and second heaters, respectively.

The above method is advantageously employed when the semiconductor chip includes a flat lower electrode (to be connected to the lower conductor) and a protruding upper electrode (to be connected to the upper conductor).

The method of the present invention may further include the step of preparing a conductive frame having the above-mentioned lower and upper conductors.

Preferably, the lower conductor may include a die pad portion, upon which the semiconductor chip is mounted, and lower lead portions extending from the die pad portion.

Preferably, the upper conductor may include upper lead portions divided into first and second groups. According to the present invention, the upper lead portions may be divided into three or more groups.

Preferably, the method of the present invention may further include the step of removing at least one of the lower and the upper lead portions from the frame. This permits a manufacturer to produce a wide variety of semiconductor devices (with different numbers of connection leads) from a single type of conductive frame.

Preferably, the frame may include first and second common bars parallel to each other. The upper lead portions in the first group extend from the first common bar toward the second common bar. On the other hand, the upper lead portions in the second group extend from the second common bar toward the first common bar.

Preferably, the method of the present invention may further include the step of rotating the upper conductor about a prescribed axis relative to the lower conductor, so that the upper conductor comes into facing relation to the lower conductor.

According to a second aspect of the present invention, there is provided a conductive frame used for making a semiconductor device. The frame includes: a lower conductive pattern which includes a die pad portion and lower lead portions extending from the die pad portion; an upper conductive pattern which includes first and second common bars parallel to each other, and upper lead portions divided into first and second groups, the upper lead portions in the first group extending from the first common bar toward the second common bar, the upper lead portions in the second group extending from the second common bar toward the first common bar. The lower and the upper conductive patterns are rotatable about a prescribed axis relative to each other, so that they come into facing relation.

Preferably, the lower and the upper lead portions may be elongated in the same direction.

Preferably, the lower and upper lead portions may be elongated along the above-mentioned axis, while the first and the second common bars may be perpendicular to the same axis.

According to a third aspect of the present invention, there may be provided a semiconductor device including: a semiconductor chip having a first surface and a second surface opposite to the first surface; a first electrode provided at the first surface; a second electrode provided at the second surface; a first lead connected to the first electrode by first solder material; and a second lead connected to the second electrode by second solder material. The first solder material differs in melting point from the second solder material.

Preferably, the first electrode may be flat, while the second electrode may not be flat. Further, the second solder material may have a lower melting point than the first solder material.

Other features and advantages of the present invention will become apparent from the detailed description given below with reference to the accompanying drawings.

BRIEF DESCRIPTION OF THE DRAWINGS

FIG. 8 is a sectional view illustrating one way for heating up the applied solder material for performing reflow soldering;

FIG. 10A is a sectional side view showing a semiconductor device according to a third embodiment of the present invention, whereas

DETAILED DESCRIPTION OF THE PREFERRED EMBODIMENT

The preferred embodiments of the present invention will be described below with reference to the accompanying drawings.

Figure 1:
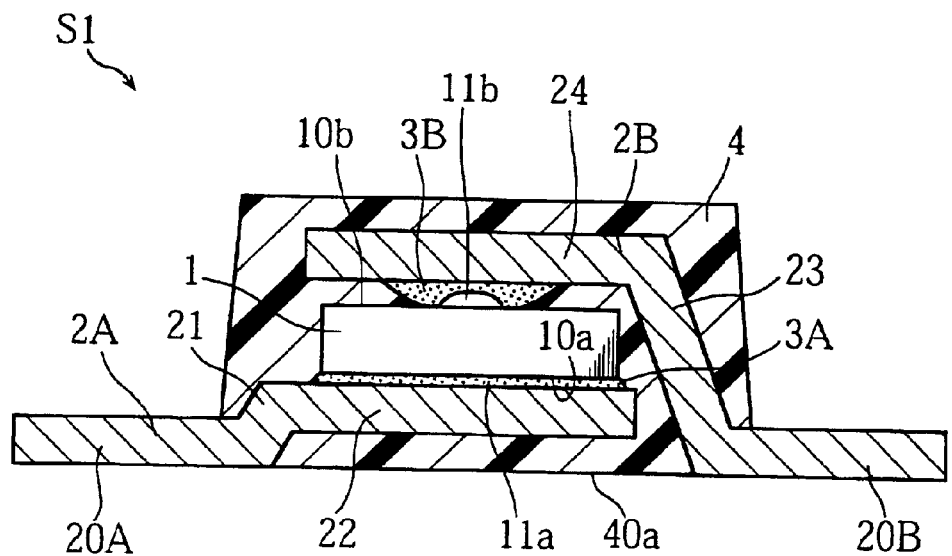
FIG. 1 is a sectional side view showing a semiconductor device according to a first embodiment of the present invention.
Figure 2:
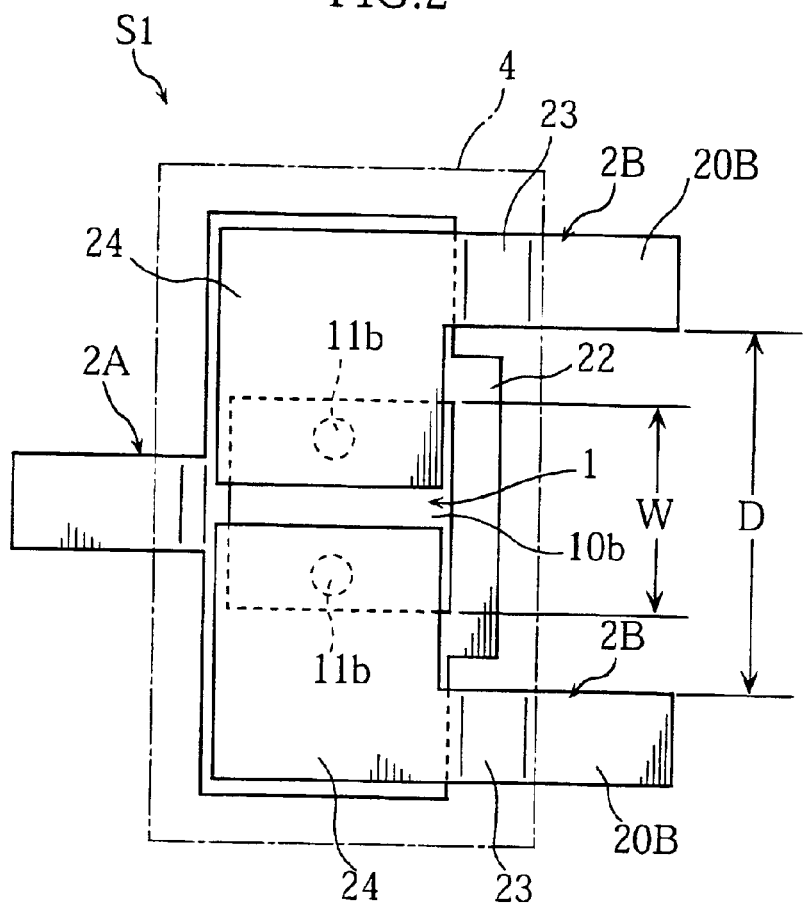
FIG. 2 is a plan view showing the device of the first embodiment, with the resin package omitted.
Figure 3:
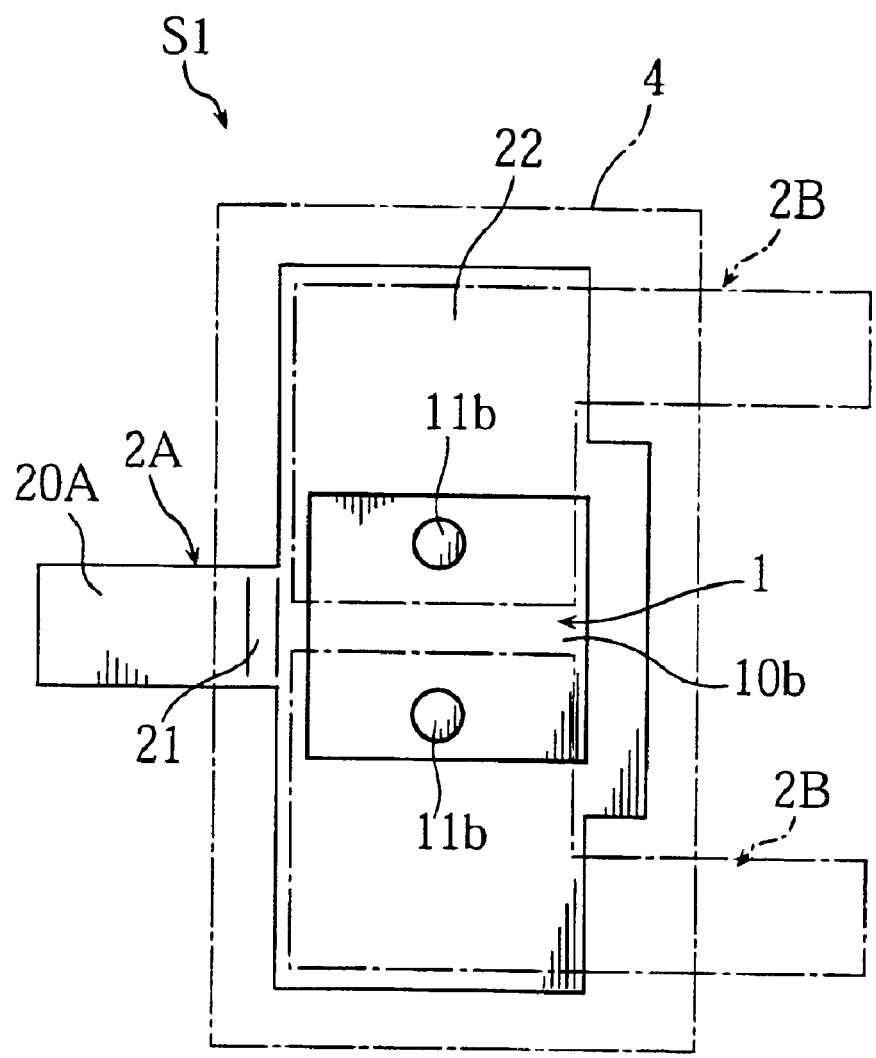
FIG. 3 is a plan view illustrating how a semiconductor chip is mounted on the first lead of the device of the first embodiment.

FIGS. 1–3 illustrate a semiconductor device according to a first embodiment of the present invention. The illustrated device S1 may be a transistor, though the present invention is not limited to this. As will be understood from the following description, the present invention is applicable not only to a transistor but also to any other semiconductor device.

As shown in the figures, the device S1 includes a semiconductor chip 1, a first lead 2A, two second leads 2B, and a resin package 4. The chip 1 has a rectangular parallelepiped configuration. The chip 1 is provided with a flat lower electrode 11a on its bottom surface 10a, and also with two protruding upper electrodes 11b on its top surface 10b. The lower electrode 11a is connected to the first lead 2A via a solder deposit 3A, while each of the upper electrodes 11b is connected to the relevant one of the second leads 2B via a solder deposit 3B. The first solder deposit 3A and the second solder deposit 3B differ in material, so that they have different melting points.

The package 4 may be made of an epoxy resin. The package 4, having a generally rectangular parallelepiped configuration, encloses the chip 1 entirely and covers the leads 2A, 2B only in part.

The first lead 2A includes an outer portion or terminal 20A projecting from one side surface of the package 4. Similarly, each of the second leads 2B includes an outer portion or terminal 20B projecting from the opposite side surface of the package 4. As shown in FIG. 1, the first terminal 20A and the second terminal 20B are flush with the bottom surface 40a of the package 4 for facilitating surface-mounting of the device S1.

Further, the first lead 2A includes a die pad portion or island 22 located within the package 4. The island 22 supports the semiconductor chip 1 and is connected to the terminal 20A via a slanting neck portion 21. As shown in FIG. 3, the island 22 is much larger than the chip 1 for facilitating heat dissipation of the chip 1. In the illustrated example, The upper surface area of the island 22 is about 3 times as large as the bottom surface area of the chip 1.

Each of the second leads 2B includes an inner horizontal portion 24. As shown in FIG. 2, the inner horizontal portion 24 is rectangular and partially overlaps the top surface 10b of the chip 1 to be connected to the upper electrode 11b. As in the island 22, the inner horizontal portion 24 is rendered large for ensuring good heat dissipation of the chip 1. As shown in FIG. 1, the horizontal portion 24 is connected to the terminal 20B via a slanting neck portion 23. In FIG. 2, the neck portion 23 (together with the terminal 20B) is offset upward or downward from the chip 1, so that the distance D between the two neck portions 23 is larger than the width W of the chip 1. In the illustrated example, the distance D is about 1.7 times as large as the width W.

As mentioned above, the solder deposits 3A and 3B are made of different materials having different melting points. Specifically, the material of the solder deposit 3A has a higher melting point (about 295° C.) than the material of the solder deposits 3B (about 240–250° C.). The higher melting point may be attained by Pb (lead)-rich material, while the lower melting point may be attained by an alloy of Sn(tin) and Sb(antimony). This difference in melting point reflects the advantageous features of a fabrication method of the device, and its significance will be understood from the following description.

Referring to FIGS. 4–7, the semiconductor device S1 may be fabricated in the following manner.

Figure 4:
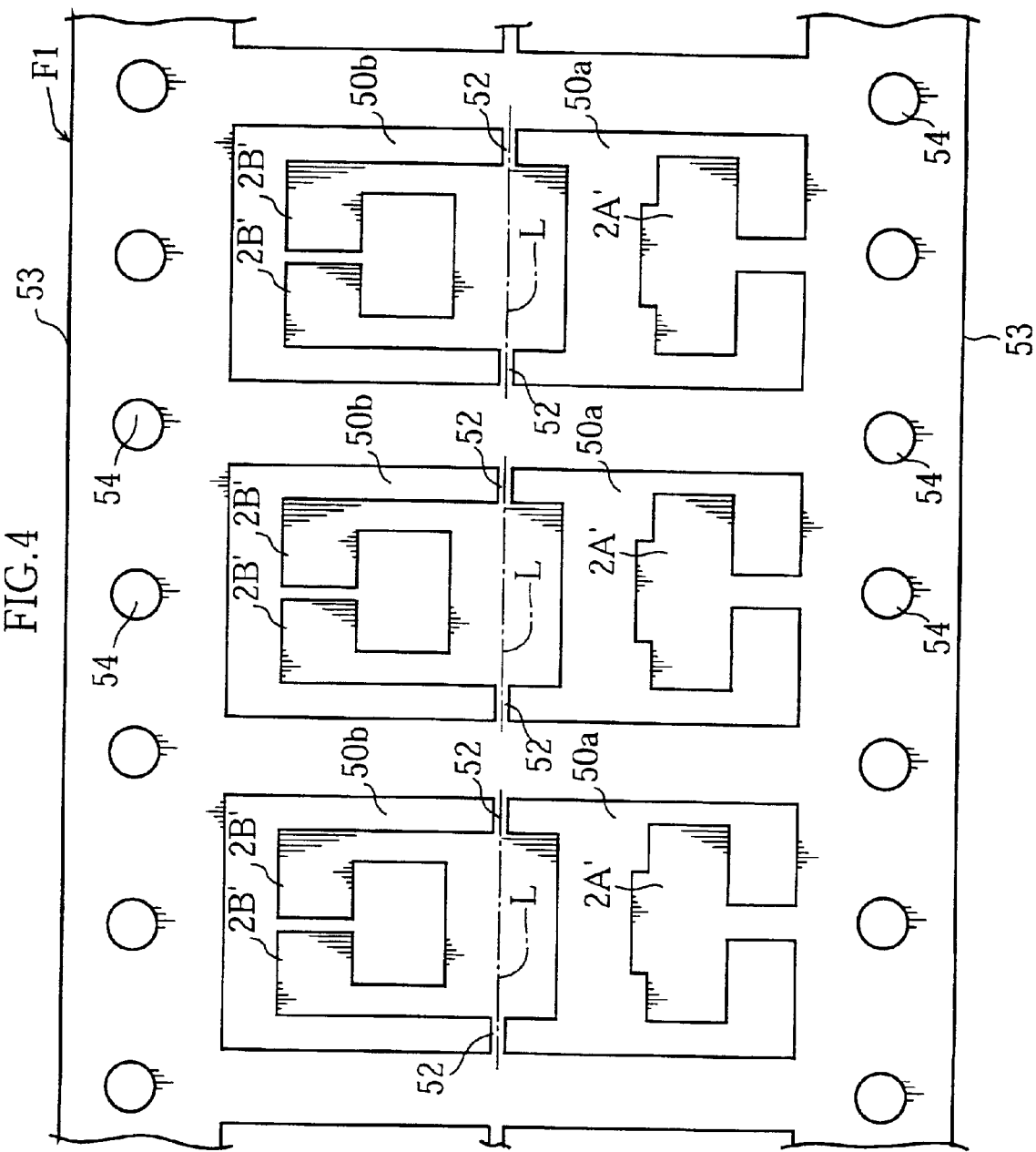
FIG. 4 is a plan view showing a conductive frame used in a method of fabricating the device of the first embodiment.

First, a conductive frame (leadframe) F1 as shown in FIG. 4 is prepared. The frame F1 is a long strip of copper provided with a predetermined pattern of openings. The frame F1 may be made by punching a copper plate. Specifically, as shown in the figure, the frame F1 includes a plurality of pairs of openings 50a and 50b. These pairs (each consisting of a first opening 50a and a second opening 50b) are arranged at regular intervals in the longitudinal direction of the frame F1. In each pair, the first opening 50a defines a first lead prototype 2A' which corresponds to the first lead 2A of the semiconductor device S1, while the second opening 50b defines second lead prototypes 2B' which correspond to the second leads 2B of the device S1. Two torsion bars 52 are provided between the first and the second openings 50a, 50b. An imaginary line L extends along the torsion bars 52.

The frame F1 is formed with indexing holes 54 arranged at regular intervals along its longitudinal edges 53. Though not shown in FIG. 4, use is made of a frame-advancing mechanism coming into engagement with the indexing holes 54. When the frame-advancing mechanism is actuated, the frame A will be moved in its longitudinal direction.

Figure 5:
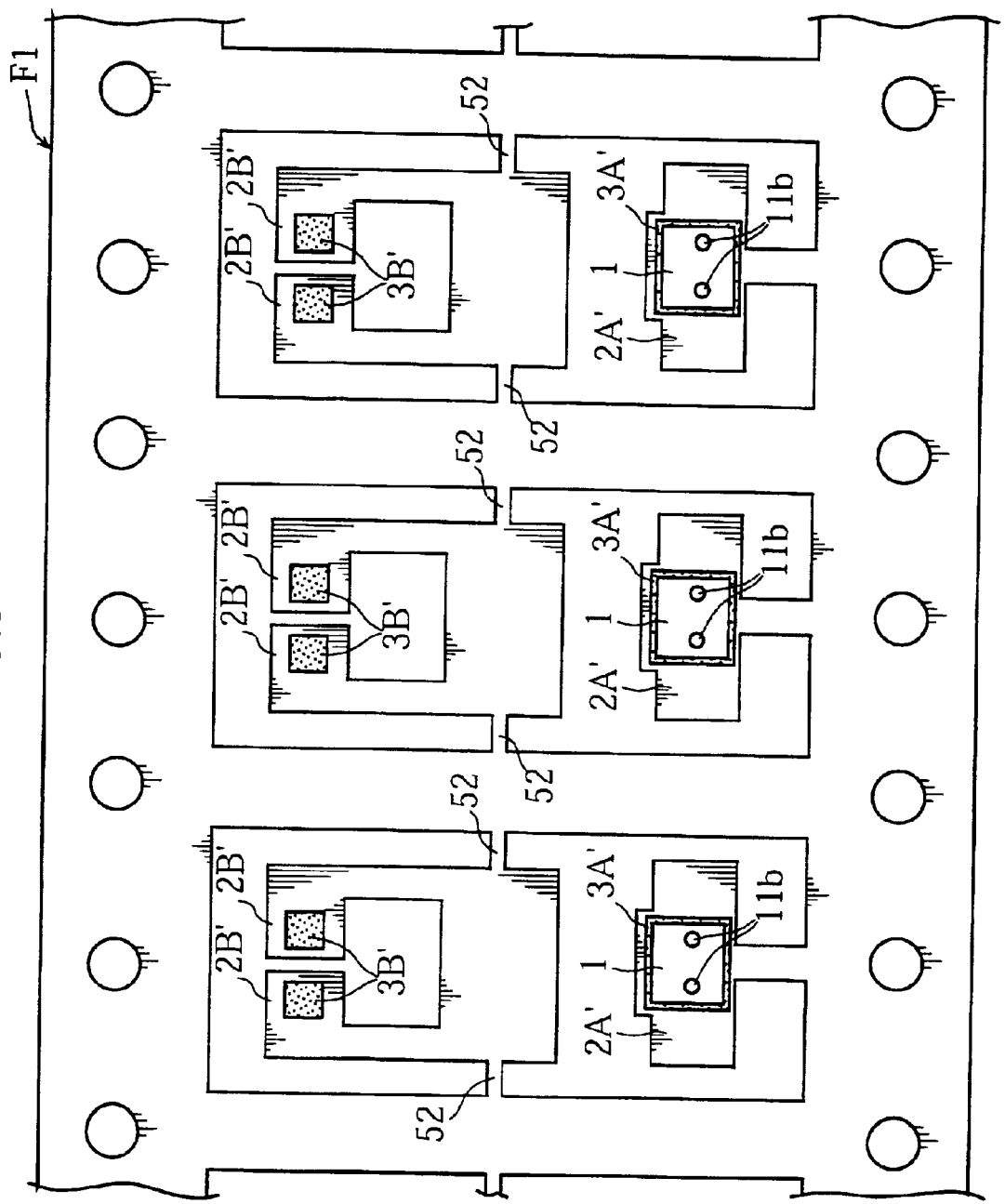
FIG. 5 is a plan view showing the conductive frame at one step of the fabrication procedure, wherein two different kinds of solder materials are applied on the frame, with semiconductor chips mounted on prescribed portions.

After the frame F1 shown in FIG. 4 has been prepared, solder paste 3A' is applied, as shown in FIG. 5, on the respective first lead prototypes 2A', whereas solder paste 3B' of a different material is applied on the respective second lead prototypes 3B'. Thereafter, semiconductor chips 1 are placed on the applied solder paste 3A' in a manner such that the second electrodes 11b are directed upward.

Figure 6:
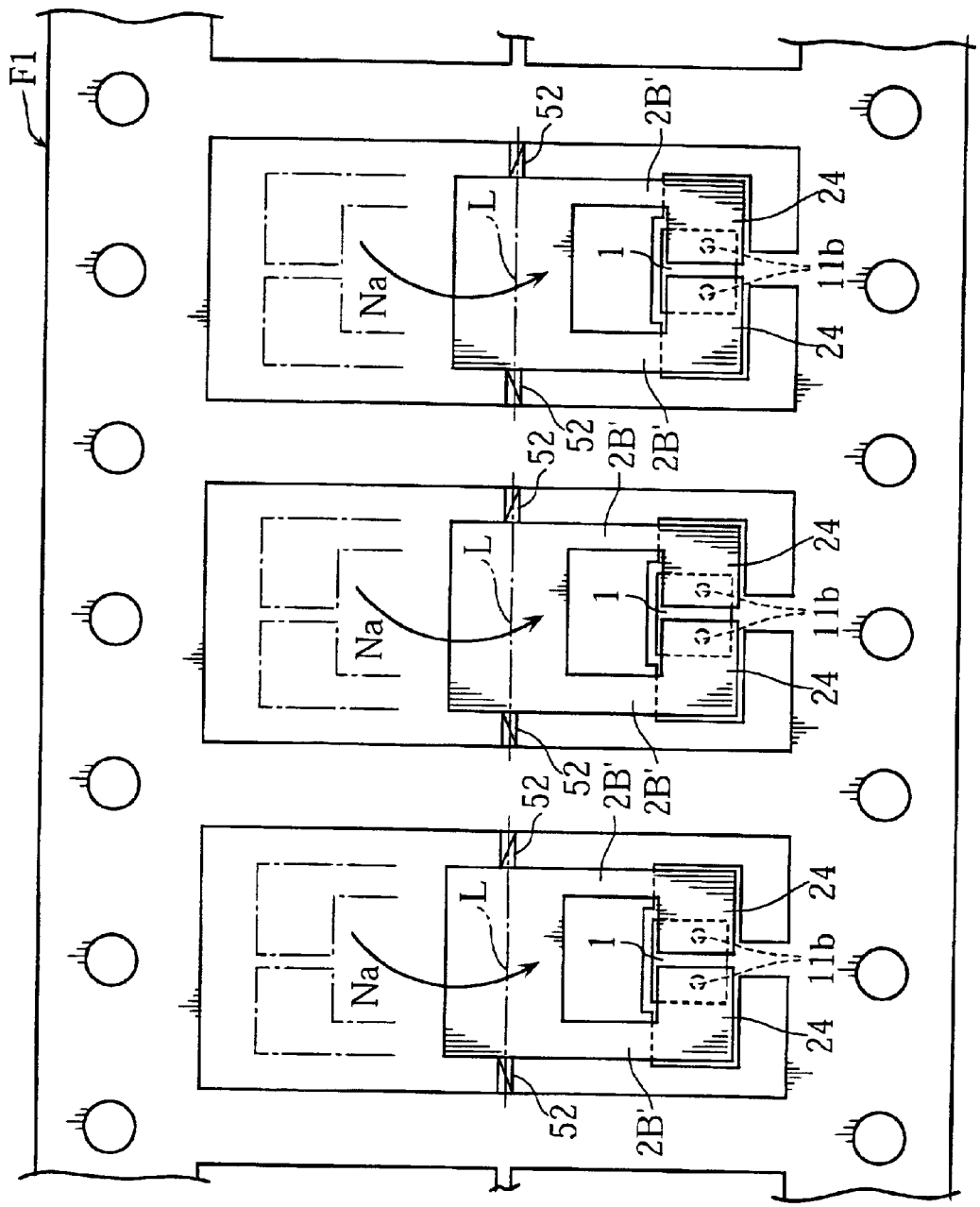
FIG. 6 illustrates the conductive frame at another step of the fabrication procedure, wherein one portion of the frame is flipped over onto the other in each of the identical units.
Figure 7:
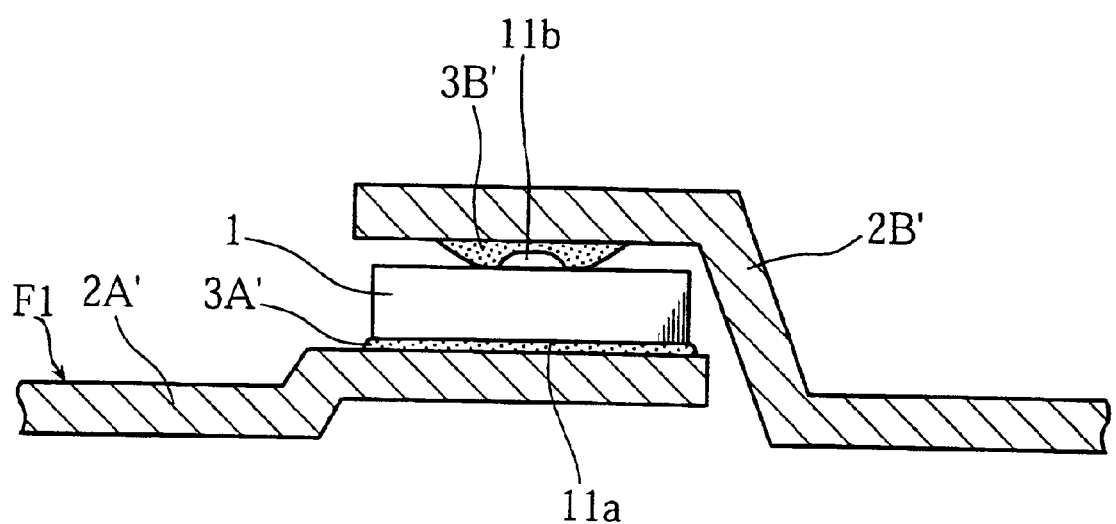
FIG. 7 is a sectional view illustrating how a semiconductor chip is held in the frame.

Then, as shown by the arrows Na in FIG. 6, each of the second lead prototypes 2B' is rotated about the imaginary line L through about 180 degrees, so that the rectangular head portion 24 is placed on the semiconductor chip 1. Thus, as shown in FIG. 7, each chip 1 is vertically sandwiched between the first lead prototype 2A' and the second lead prototype 2B', with the solder paste 3A', 3B' provided therebetween.

Then, the frame F1 together with the chips 1 is put into a furnace to melt the applied solder paste 3A', 3B'. Then, the frame-chip assembly is taken out from the furnace to cool the solder material for solidification. In this cooling process, the solder 3A (having a higher melting point) will solidify earlier than the solder 3B (having a lower melting point). This is advantageous to securing each semiconductor chip 1 to the first lead prototype 2A'. Since the solidification of the solder 3B comes later, it is possible to prevent the chip 1 from being raised toward the second lead prototype 2B'.

Though not shown in the figures, a resin material is applied to enclose the chips 1 together with parts of the lead prototypes 2A', 2B' after the complete solidification of the solder 3A, 3B. This resin coating may be performed by a transfer molding technique. Finally, predetermined cuts are made in the frame F1 and the resin coat, so that individual semiconductor devices are obtained.

In the above-described method, use is made of a furnace to melt the applied solder materials, though the present invention is not limited to this. For instance, as shown in FIG. 8, two heating blocks 6A, 6B may be used for melting solder deposits 3C' and 3D'. Differing from the above-described method, the solder deposit 3C' may be made of the same material as the solder deposit 3D'. As illustrated, the first lead prototype 2A' is placed on the first heating block 6A, and the second lead prototypes are placed on the second heating block 6B. Then, the first and the second heating blocks 6A, 6B are turned on at the same time. Upon this, the respective heating blocks 6A, 6B, which incorporate a heating resistor, will heat up the first and the second lead prototypes 2A', 2B', respectively. The thus generated heat is conducted through the lead prototypes 2A', 2B', and melts the applied solder materials 3C', 3D'.

Thereafter, the first heating block 6A is turned off, while the second heating block 6B is still on. As a result, only the solder material 3C begins to solidify, to secure the chip 1 to the first lead prototype 2A'. After the chip 1 is firmly fixed to the prototype 2A', the second heating block 6B is turned off, allowing the solder material 3D' to solidify.

With the above procedure, the same kind of solder material is used for connecting the chip 1 to both the first and the second lead prototypes 2A', 2B'. This helps the required solder application step (e.g. screen printing) to take less time than when different kinds of solder materials are used.

In the second fabrication method described above, two heating blocks are used. However, it is also possible to use only a single heater which is movable about the chip 1. In this case, the solder deposits 3C', 3D' are simultaneously melted by the radiant heat from the heater which is equally spaced from the solder deposits 3C' and 3D'. Then, the heater is moved closer to the solder material 3D' than to the solder material 3C'. As a result, the solder material 3C' is allowed to cool down earlier than the solder material 3D'. Thus, the chip 1 is secured to the first lead prototype 2A', while the solder material 3D' is still in a molten state. Thereafter, the heater is brought away from the chip 1 and the frame F1, thereby allowing the solder material 3D' to solidify.

Figures 9A, 9B:
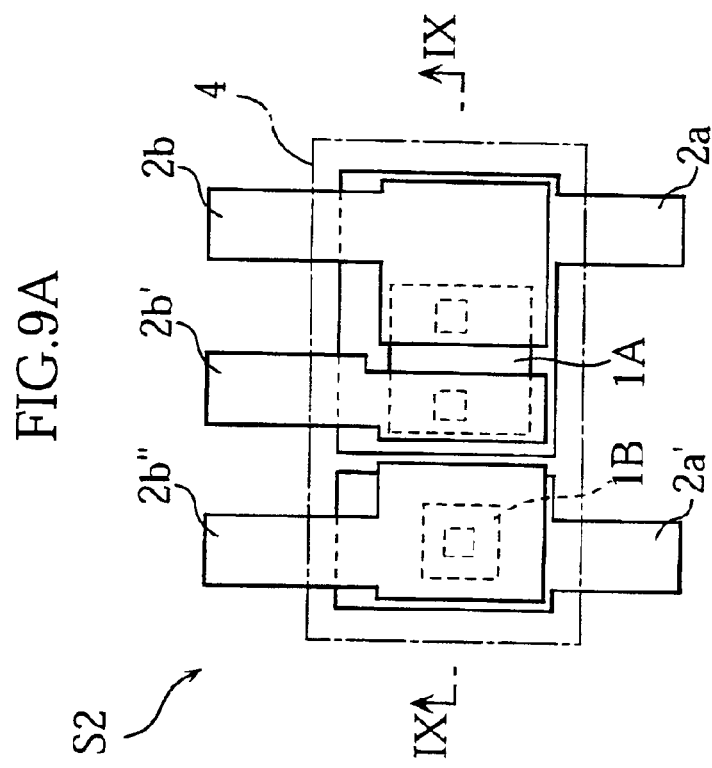
FIGS. 9A and 9B show a semiconductor device according to a second embodiment of the present invention.

FIGS. 9A and 9B illustrate a semiconductor device according to a second embodiment of the present invention. The illustrated device S2 includes two semiconductor chips 1A and 1B enclosed by a common resin package 4. The first chip 1A is supported by a first lead 2a, and the second chip 1B is supported by another first lead 2a'. On their upper sides, the first chip 1A is connected to two second leads 2b and 2b', and the second chip 1B is connected to another second lead 2b''.

Figure 10B:
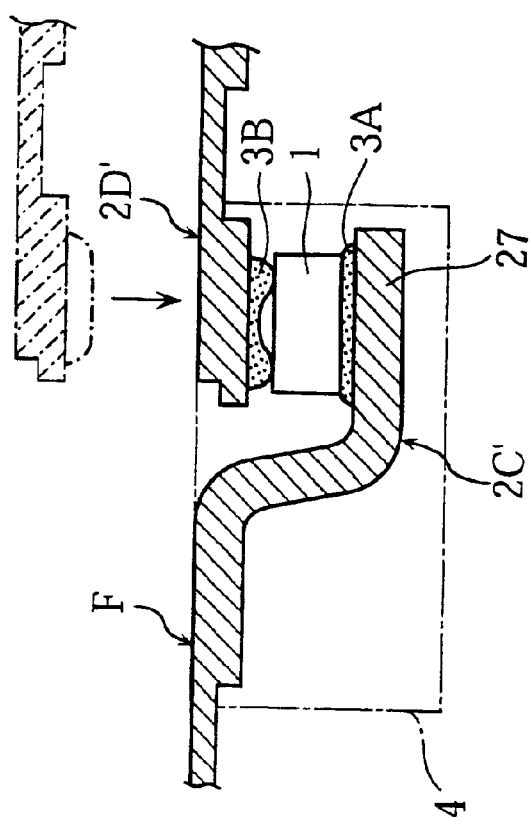
FIG. 10B shows one step of a fabrication method of the device.
Figure 10A:
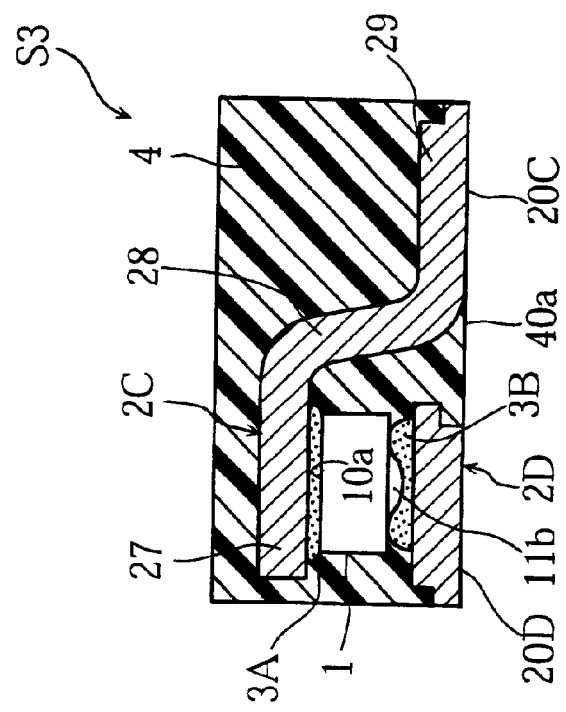

FIGS. 10A and 10B illustrate a semiconductor device according to a third embodiment of the present invention. The illustrated device S3 includes a semiconductor chip 1, a first lead 2C, a second lead 2D, and a resin package 4. As shown in FIG. 10A, the first lead 2C includes an inner horizontal portion 27, a terminal portion 29 and a slanting neck portion 28 connecting the inner portion 27 to the terminal portion 29. The terminal portion 29 has an exposed surface 20C which is flush with the bottom surface 40a of the package 4. The inner portion 27 is connected to an electrode (not shown) in the upper surface 10a of the chip 1 via a solder deposit 3A. The second lead 2D is connected to an electrode 11b in the lower surface of the chip 1 via a solder deposit 3B. As shown in FIG. 10A, the second lead 2D includes an exposed surface 20d which is flush with the bottom surface 40a of the package 4.

The semiconductor device S3 is fabricated in the following manner. Referring to FIG. 10B, the semiconductor chip 1 is mounted on the first lead prototype 2C' of a frame F1, with a solder material 3A applied beforehand. Then, the second lead prototype 2D' is brought into contact with the chip 1 via a solder material 3B. In the third embodiment, the solder material 3A has a higher melting point than the solder material 3B, so that the former will solidify earlier than the latter.

Figure 11:
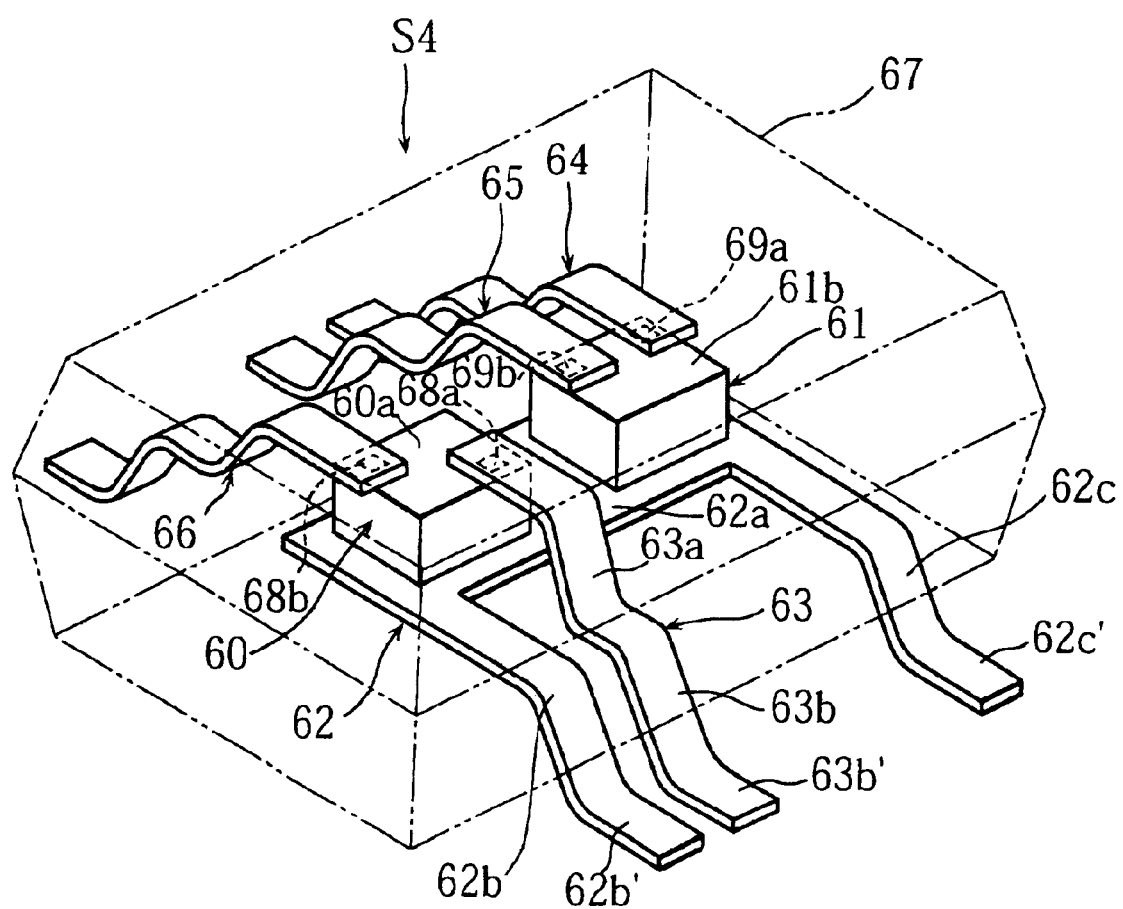
FIG. 11 is a perspective view showing a semiconductor device according to a fourth embodiment of the present invention.

FIG. 11 shows a semiconductor device according to a fourth embodiment of the present invention. The illustrated device S4 includes two semiconductor chips (first chip 60 and second chip 61), a lower lead 62 supporting these chips, four upper leads (first upper lead 63, second upper lead 64, third upper lead 65 and fourth upper lead 66), and a protection resin package 67 which enclose the chips 60–61 entirely and covers each of the leads 62–66 partially.

The lower lead 62 includes a die pad 62a, a first leg 62b and a second leg 62c parallel to the first leg 62b. The die pad 62a is rectangular and soldered to lower electrodes (not shown) formed on the respective bottom surfaces of the first and second chips 60, 61. The applied solder material has a relatively high melting point (about 295° C. for example). The first leg 62b and the second leg 62c are spaced from each other in the longitudinal direction of the die pad 62a. Each of the first and the second legs 62b, 62c includes a straight inner portion enclosed by the package 67, and a bent outer portion exposed from the package 67. The outer portion of the first leg 62b includes a horizontal terminal 62b' flush with the bottom surface of the package 67. Similarly, the outer portion of the second leg 62c includes a horizontal terminal 62c' flush with the bottom surface of the package 67.

The first upper lead 63 includes a bent inner portion 63a enclosed by the package 67 and a bent outer portion 63b exposed from the package 67. The inner portion 63a is soldered to a connection pad 68a provided in the upper surface 60a of the first chip 60. The applied solder material has a relatively low melting point (about 240–250° C. for example). The first upper lead 63 protrudes from the same side surface of the package 67 as the lower lead 62.

The second, the third and the fourth upper leads 64–66 are basically the same in configuration as the first upper lead 63 described above. Specifically, each of the leads 64–66 includes a bent inner portion enclosed by the package 67 and a bent outer portion exposed from the same package. The leads 64–66 are exposed from the same side surface of the package 67. The protruding direction of the leads 64–66 is opposite to that of the first upper lead 63. The outer portions of the respective leads 64–66 include a horizontal terminal flush with the bottom surface of the package 67. Turning to the inner portions of the second and the third upper leads 64–65, they are soldered to connection pads 69a and 69b, respectively, formed in the upper surface 61b of the second chip 61. The inner portion of the fourth upper lead 66 is soldered to a connection pad 68b formed in the upper surface 60a of the first chip 60. The applied solder material with respect to the second, the third and the fourth upper leads 64–66 is the same as that applied to the first upper lead 63, thereby having the same low melting point (240–250° C).

Figure 12:
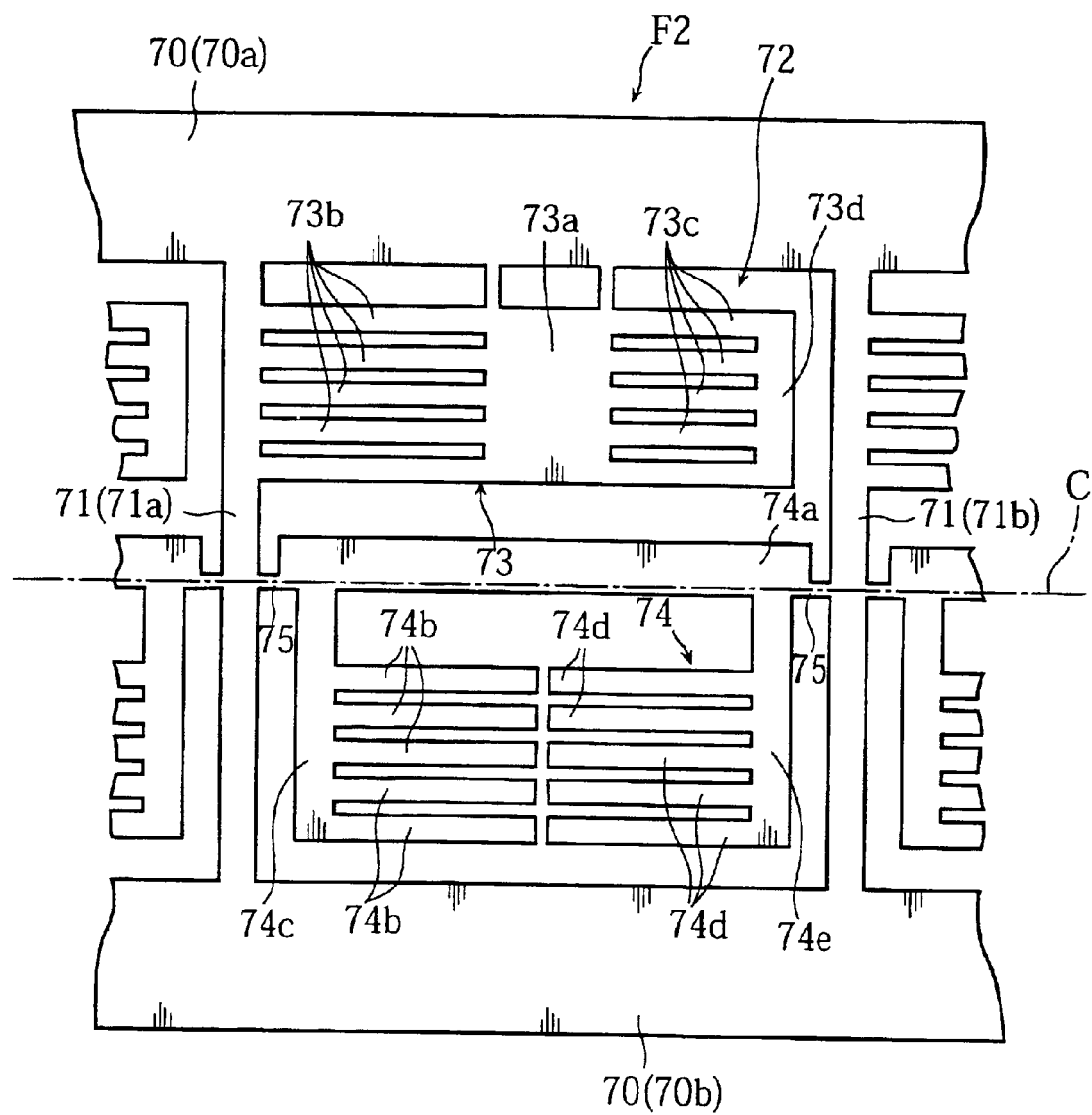
FIG. 12 is a plan view showing a principal portion of a conductive frame used for making the semiconductor device of the fourth embodiment.

The semiconductor device S4 having the above structure may be fabricated by using a conductive frame F2 shown in FIG. 12. As seen from the figure, the frame F2 includes a pair of side bars 70 (first side bar 70a and second side bar 70b) parallel to each other, and a plurality of tie bars 71 (only two shown in the figure) perpendicular to the side bars 70. The tie bars 71 are arranged at regular intervals in the longitudinal direction of the frame F2. The side bars 70 and any pair of adjacent tie bars 71 (first tie bar 71a and second tie bar 71b) define a rectangular region 72 used for producing one semiconductor device.

Each rectangular region 72 is provided with a first conductive pattern 73 and a second conductive pattern 74. As shown in FIG. 12, the first pattern 73 is initially connected to the first side bar 70a and to the first tie bar 71a. The second pattern 74, on the other hand, is initially connected to the first and the second tie bars 71a, 71b via two torsion bars 75. As will be described later, the second conductive pattern 74 is rotated about an axis C, which extends through the two torsion bars 75, to be brought into facing relation to the first conductive pattern 73.

The first conductive pattern 73 includes a rectangular die pad portion 73a, first lower lead portions 73b and second lower lead portions 73c. The first and the second lower lead portions 73b, 73c extend from the die pad portion 73a in the opposite directions. The first lower lead portions 73b connect with the first tie bar 71a, while the second lower lead portions 73c connect with a hovering bridge 73d.

The second conductive pattern 74 includes a base strip 74a, first upper lead portions 74b, a first common bar 74c, second upper lead portions 74d, a second common bar 74e. The first upper lead portions 74b connect with the first common bar 74c, while the second upper lead portions 74d connect with the second common bar 74e. As shown, both the first and the second common bars 74c, 74e connect with the base strip 74a.

The frame F2 having the above structure may be prepared by punching a nickel (Ni) plate into the prescribed form, or by subjecting a Ni plate to wet etching for example.

Figure 13:
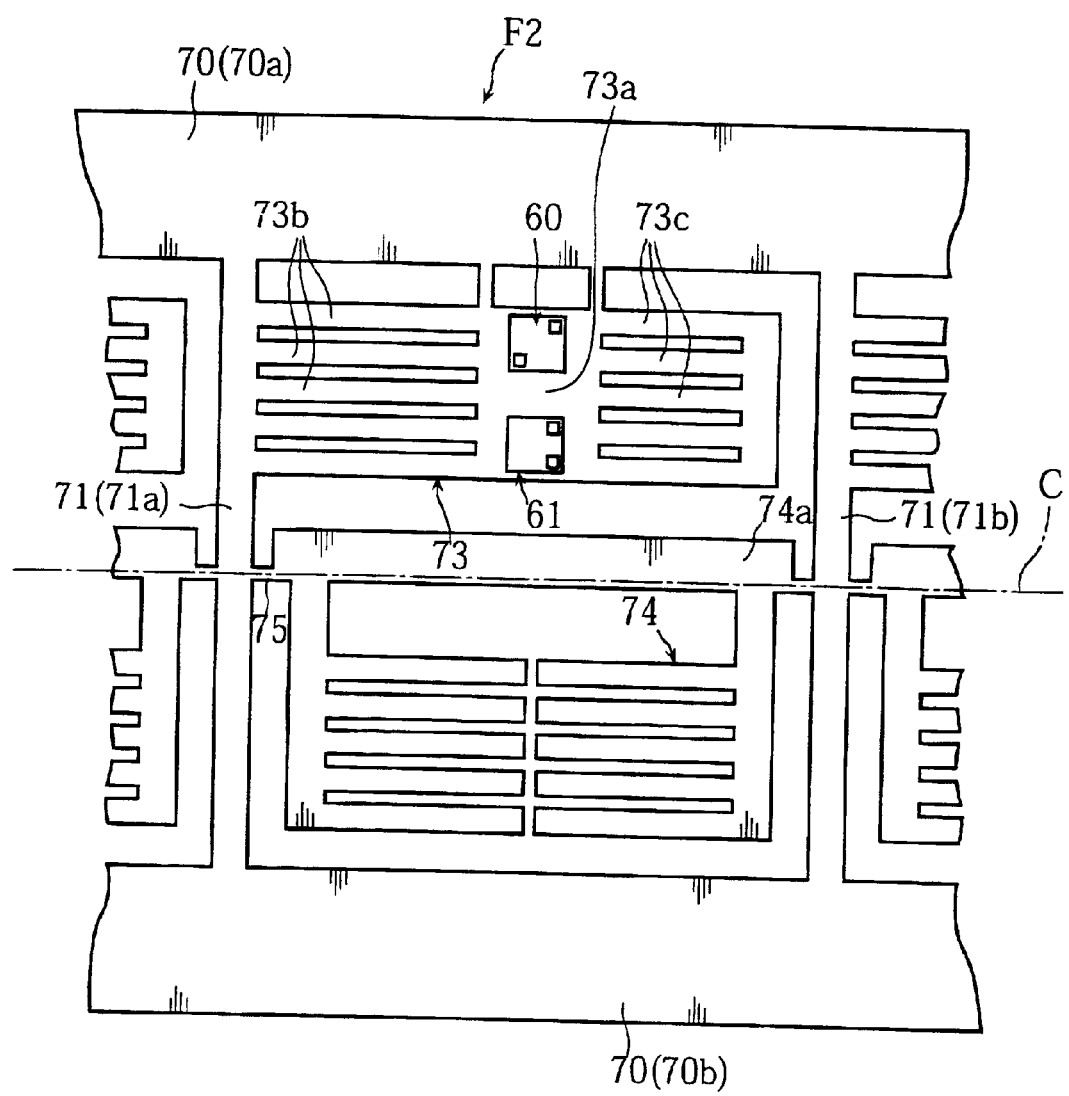
FIG. 13 shows the same conductive frame with semiconductor chips mounted thereon.

After the frame F2 is prepared, two semiconductor chips 60, 61 are mounted onto each die pad portion 73a, as shown in FIG. 13. Prior to this, though not illustrated, solder paste is applied between the respective chips 60, 61 and the die pad portion 73a.

Figure 14:
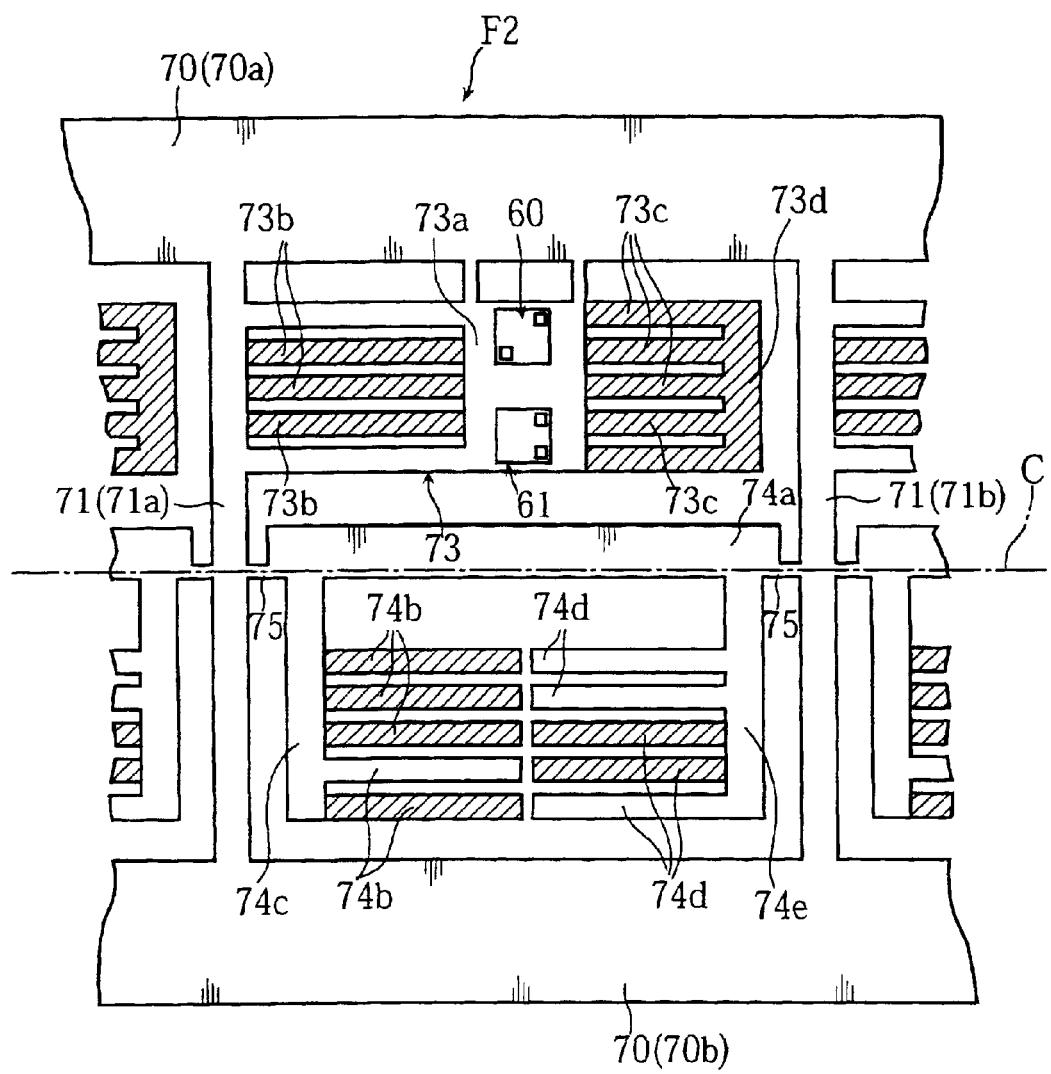
FIG. 14 shows nonselected lead portions to be removed from the frame.

Then, referring to FIG. 14, nonselected lead portions (shaded in the figure) are removed from the frame F2. This removal may be achieved by subjecting the frame F2 to pressing with the use of a suitably configured die. During the pressing, the lead portions 74b and 74d are bent into the prescribed intermediate form (see FIG. 16).

Figure 15:
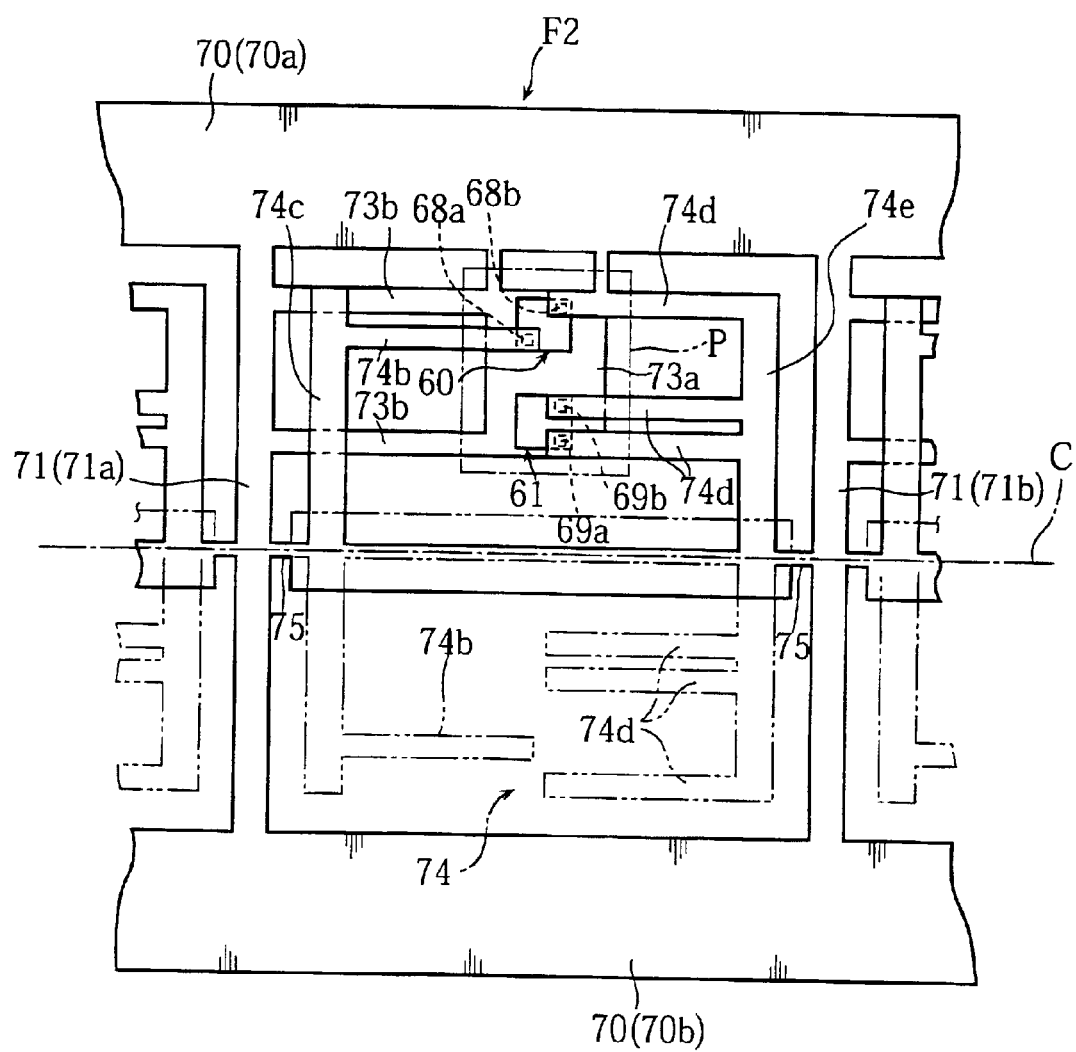
FIG. 15 illustrates a lead portion turning step to which the conductive frame is subjected.

Then, as shown in FIG. 15, the modified second conductive pattern 74 is rotated about the axis C through 180°, so that the lead portion 74b overlaps the connection pad 68a of the first chip 60, and that each of the remaining lead portions 74d overlaps the relevant one of the connection pads 68b, 69a and 69b of the first or second chip 60 or 61. Thereafter, the frame-chip assembly is subjected to reflow soldering with the use of a furnace or any other possible heating means.

Figure 16:
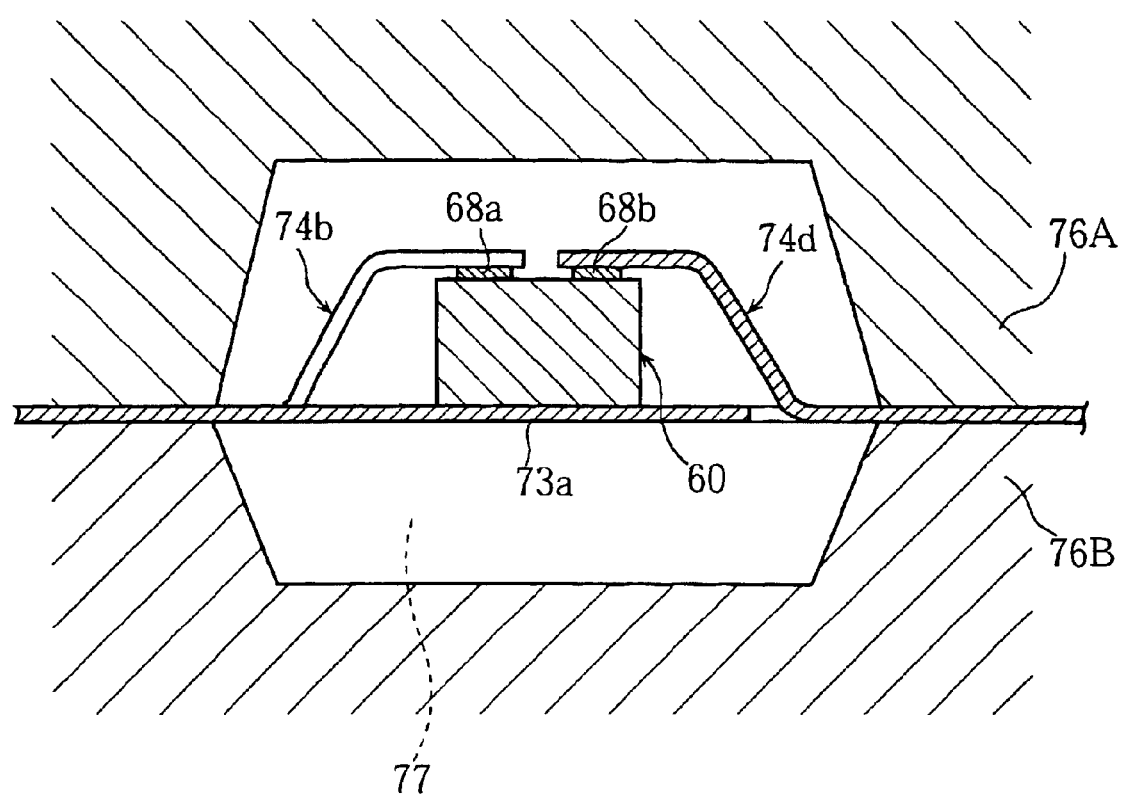
FIG. 16 illustrates a resin package forming step.

Then, a resin package is formed in the region P (FIG. 15) to enclose the chips 60, 61 and the prescribed parts of the lead portions 73*b*, 74*b* and 74*d*. To this end, as shown in FIG. 16, use may be made of an upper molding member 76A and a lower molding member 76B. In cooperation, the upper and the lower molding members 76A and 76B produce a cavity 77, into which molten resin material (epoxy resin for example) is poured.

Then, the applied resin material is cooled down to solidify. Thereafter, the upper and the lower molding members 76A, 76B are separated. Finally, the resin coated frame-chip-assembly is subjected to a lead cutting process and to a lead forming process. Thus, a product semiconductor device as shown in FIG. 11 is obtained.

According to the above-described fabrication method, the single conductive frame F2 can be used for producing many different types of semiconductor devices by selectively removing the lead portions, as described with reference to FIG. 14.

Figure 17:
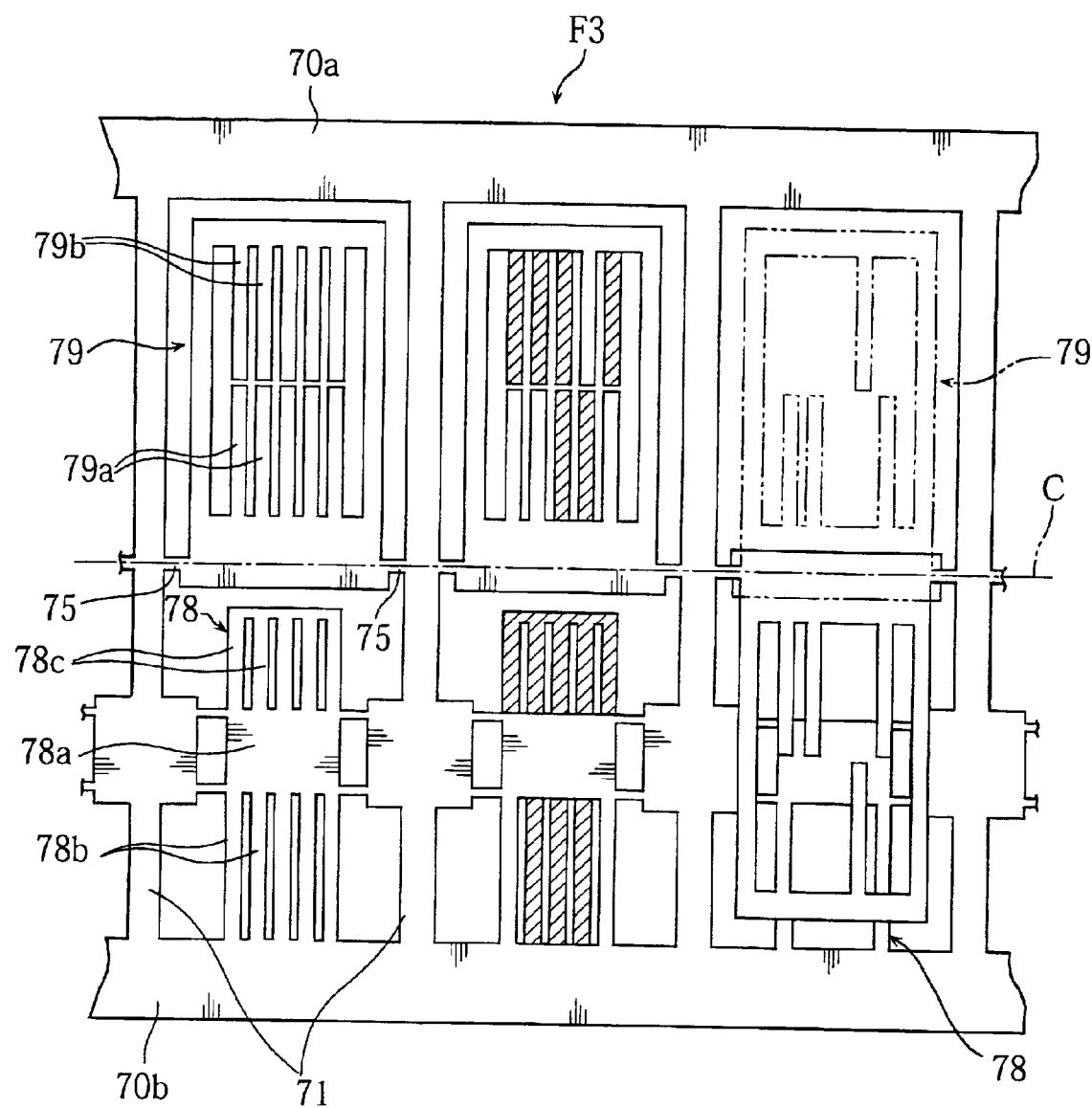
FIG. 17 shows a conductive frame of a different design usable for making the semiconductor device of the fourth embodiment.
Figure 18:
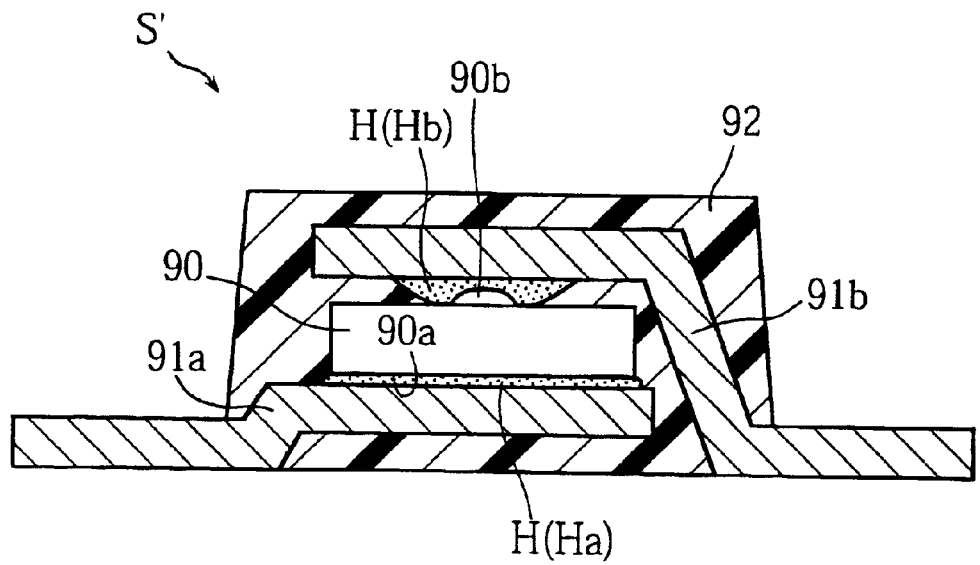
FIGS. 18 and 19 are sectional side views showing the principal portions of a conventional semiconductor device.
Figure 19:
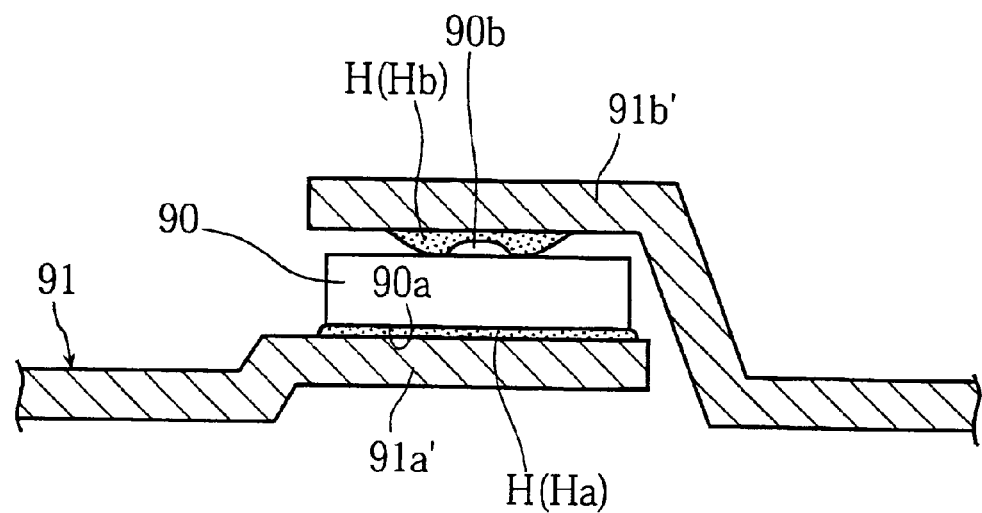
Figure 20:
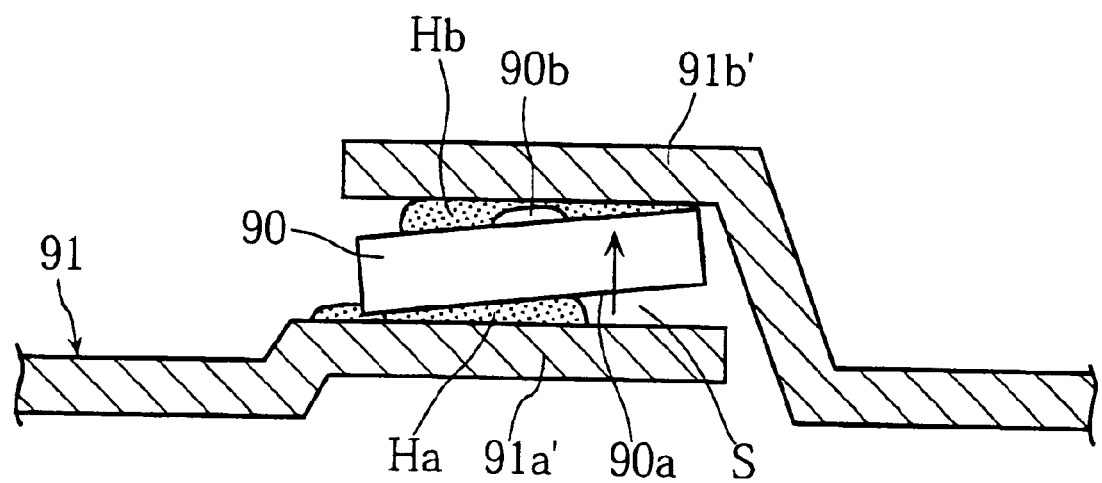
FIG. 20 illustrates a problem encountered in the conventional semiconductor device.

According to the present invention, the semiconductor device S4 described above can be fabricated by using a conductive frame F3 shown in FIG. 17. As illustrated, the frame F3 includes a pair of longitudinal side bars 70*a*–70*b* and a plurality of tie bars 71 extending between the side bars 70*a*–70*b*. The side bars 71 are arranged at regular intervals in the longitudinal direction of the frame F3. The side bars 70*a*–70*b* and any two adjacent tie bars 71 define one unit region in which a first conductive pattern 78 and a second conductive pattern 79 are provided. The second conductive pattern 79 is connected to the tie bars 71 via torsion bars 75. As in the previous frames F1 and F2, the second conductive pattern 79 is rotatable about the axis C extending through the torsion bars 75.

The first conductive pattern 78 includes a die pad portion 78*a*, first lower lead portions 78*b* and second lower lead portions 78*c*. The second conductive pattern 79 includes first upper lead portions 79*a* and second upper lead portions 79*b*. The third frame F3 differs from the first and the second frames F1, F2 in that the lead portions 78*b*–78*c* and 79*a*–79*b* are elongated widthwise of the frame F3 (the counterpart lead portions of the first and the second frames are elongated in the longitudinal direction of these frames).

In the above-described frame F3 again, nonselected lead portions, which are shaded in FIG. 17 (middle), are removed by pressing for example. Thereafter, the modified second conductive pattern 79 is rotated about the axis C, to be brought into facing relation to the modified first conductive pattern 78 (right in FIG. 13). Clearly, the same semiconductor device as shown in FIG. 11 can be made with the use of the third conductive frame F3.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A method of making a semiconductor device, the method comprising the steps of:
   mounting a semiconductor chip on a lower conductor, with first solder material applied between the chip and the lower conductor;
   positioning an upper conductor on the chip, with second solder material applied between the chip and the upper conductor;
   simultaneously heating up the first and the second solder materials beyond melting points of the respective solder materials such that the first and the second solder materials are simultaneously in a molten state; and
   solidifying the first and the second solder materials;
   wherein the lower conductor includes a die pad portion for mounting the semiconductor chip; and
   wherein the first solder material has a melting temperature higher than that of the second solder material and is caused to solidify earlier than the second solder material in the solidifying step for securing the semiconductor chip on the die pad portion of the lower conductor before the upper conductor is fixedly connected to the semiconductor chip.

2. The method according to claim 1, wherein the heating of the first solder material is terminated earlier than the heating of the second solder material.

3. The method according to claim 1, wherein the heating of the first and the second solder materials is performed by contacting the lower and the upper conductors with first and second heaters, respectively.

4. The method according to claim 1, wherein the semiconductor chip includes a flat lower electrode and a protruding upper electrode, the lower electrode being connected to the lower conductor, the upper electrode being connected to the upper conductor.

5. The method according to claim 1, further comprising the step of preparing a conductive frame which includes the lower and the upper conductors.

6. The method according to claim 5, wherein the lower conductor comprises lower lead portions extending from the die pad portion.

7. The method according to claim 5, wherein the upper conductor comprises upper lead portions.

8. The method according to claim 5, further comprising the step of rotating the upper conductor about an axis relative to the lower conductor, so that the upper conductor comes into facing relation to the lower conductor.

9. The method according to claim 1, further comprising the step of preparing a conductive frame which includes a first conductive pattern and a second conductive pattern, the first conductive pattern including the lower conductor, the second conductive pattern including the upper conductor.

10. The method according to claim 9, wherein the lower conductor further comprises lower lead portions extending from the die pad portion.

11. The method according to claim 10, wherein the second conductive pattern comprises upper lead portions at least one of which is to be connected to the semiconductor chip as the upper conductor.

12. The method according to claim 11, further comprising the step of removing at least one of the lower and the upper lead portions from the frame.

13. The method according to claim 11, wherein the frame comprises first and second common bars parallel to each other, the upper lead portions being divided into first and second groups, the upper lead portions in the first group extending from the first common bar toward the second common bar, the upper lead portions in the second group extending from the second common bar toward the first common bar.

14. A method of making a semiconductor device, the method comprising the steps of:
   mounting a semiconductor chip on a lower conductor, with first solder material applied between the chip and the lower conductor;
   positioning an upper conductor on the chip, with second solder material applied between the chip and the upper conductor;
   simultaneously heating up the first and the second solder materials beyond melting points of the respective solder materials by contacting the lower and the upper conductors with first and second heaters, respectively, such that both the first and the second solder materials are simultaneously in a molten state; and solidifying the first and the second solder materials;

wherein the first solder material is caused to solidify earlier than the second solder material in the solidifying step; and wherein the heating of the first solder material is terminated earlier than the beating of the second solder material.

15. A method of making a semiconductor device, the method comprising the steps of:

mounting a semiconductor chip on a lower conductor, with first solder material applied between the chip and the lower conductor;

positioning an upper conductor on the chip with second solder material applied between the chip and the upper conductor;

simultaneously heating up the first and the second solder materials beyond melting points of the respective solder materials such that both the first and the second solder materials are simultaneously in a molten state; and solidifying the first and the second solder materials;

wherein the first solder material is caused to solidify earlier than the second solder material in the solidifying step; and wherein the heating of the first and the second solder materials is performed by contacting the lower and the upper conductors with first and second heaters, respectively.

* * * * *